United States Patent [19]

Parkinson et al.

[11] Patent Number: 5,325,331

[45] Date of Patent: Jun. 28, 1994

[54] IMPROVED DEVICE FOR SENSING INFORMATION STORE IN A DYNAMIC MEMORY

[75] Inventors: Ward D. Parkinson; Paul S. Zagar, both of Boise, Id.

[73] Assignee: Micron Technology, Inc.

[21] Appl. No.: 680,588

[22] Filed: Apr. 4, 1991

[51] Int. Cl.$^5$ ............................................. G11C 7/00
[52] U.S. Cl. ................................. 365/189.06; 365/205; 365/222
[58] Field of Search ............... 365/189.06, 189.11, 365/203, 205, 207, 208, 222; 307/530

[56] References Cited

U.S. PATENT DOCUMENTS

| | | | |
|---|---|---|---|
| 4,028,557 | 6/1977 | Wilson | 307/362 |
| 4,081,701 | 3/1978 | White, Jr. et al. | 307/355 |
| 4,421,996 | 12/1983 | Chuang et al. | 307/530 |
| 4,508,980 | 4/1985 | Puar | 307/530 |
| 4,551,641 | 11/1985 | Pelley, III | 365/205 |
| 4,627,033 | 12/1986 | Hyslop et al. | 365/205 |
| 4,634,901 | 1/1987 | McElroy | 307/530 |
| 4,716,320 | 12/1987 | McAdams | 307/530 |
| 4,727,519 | 2/1988 | Morton et al. | 365/233 |
| 4,780,850 | 10/1988 | Miyamoto et al. | 365/208 X |
| 4,791,613 | 12/1988 | Hardee | 365/189 |
| 4,800,525 | 1/1989 | Shah et al. | 365/72 |
| 4,808,857 | 2/1989 | Naito et al. | 307/530 |
| 4,939,693 | 7/1990 | Tran | 365/190 |
| 5,132,936 | 7/1992 | Keswick et al. | 365/189.06 |

FOREIGN PATENT DOCUMENTS 0285796 11/1988 Japan .................. 365/189.06

OTHER PUBLICATIONS

R. L. Bishop and R. R. DeSimone, *High Sensitivity, High-Speed Fet Sense Latch*, IBM Technical Disclosure Bulletin, vol. 18, No. 4, Sep. 1975, pp. 1021, 1022.

Primary Examiner—Seungsook Ham

[57] ABSTRACT

To enhance the speed at which dynamic random access memories are refreshed, each sensing amplifier is provided with a clamping transistor. The clamping transistor is connected to a preselected voltage source. The clamping transistor prevents the voltage on the low-going bit line from falling to circuit ground by clamping the voltage on the low-going bit line to the preselected voltage.

17 Claims, 3 Drawing Sheets

IMPROVED DEVICE FOR SENSING INFORMATION STORE IN A DYNAMIC MEMORY

BACKGROUND OF THE INVENTION

1. Technical Field

This invention generally relates to dynamic memory devices, and, more particularly, this invention relates to a sense amplifier circuit for a dynamic random access memory formed as a single integrated circuit device.

2. Description of Related Art

Numerous dynamic random access memories (DRAMs) are known in the related art. Typically, DRAMs are manufactured using arrays of single-transistor memory cells. To achieve the best results, the single-transistor cells are fabricated as metal-oxide semiconductor field effect transistors (MOSFETs) on a single silicon substrate. Each MOSFET is connected to a small capacitance that stores an electric charge. Usually, a logical "1" is represented by the presence of a charge on the storage capacitance, and a logical "0" is represented by the lack of a charge on the storage capacitance.

Since the charge stored on the storage capacitance gradually leaks, information must be periodically re-written before the charge leaks out completely. This operation is commonly referred to as "refreshing" the memory cells. The frequency at which the cells need to be refreshed depends on the rate of leakage of the MOSFET.

DRAMs include a plurality of bit lines that are used to sense or read information stored in the cells and to write information into the cells. The bit lines interconnect with respective word lines that are shared by all of the memory cells in each row. The MOSFETs are connected between the word lines and the storage capacitances to selectively provide access to the information stored by the capacitances. Thus, these MOSFETs are commonly referred to as access transistors. When a selected word line is enabled, the data from each memory cell in the selected row is coupled to the respective bit lines through the access transistors.

The bit lines are connected in pairs to a differential sense amplifier. Prior to the selection of a cell, the bit lines are brought to equal potentials, i.e., equilibrated, by n-channel MOSFET transistors. The gate of the equilibrate transistor is turned off, and, then, one of the pair of bit lines is coupled to a selected cell. The sense amplifier compares the charge on the cell's storage capacitance to the charge on the other bit line. The sense amplifier receives the differential voltage between the pair of bit lines, and amplifies the differential voltage to produce a signal representative of the logical state of the memory cell connected to the selected bit line. At the same time, the sense amplifier also refreshes the storage capacitance.

Conventionally, in DRAMs each sense amplifier pulls its respective bit line to circuit ground through one or two transistors. If two transistors are used, the first transistor to be turned on is small so that the sense amplifier begins to amplify slowly. Then, a second, larger transistor is turned on so that the sense amplifier amplifies quickly to discharge the bit line to ground. In addition, the gates of the unselected access transistors in the memory cells are normally at ground potential when turned off. Therefore, the resistance of the access transistors must be sufficiently high to ensure no leakage through the transistors to their associated bit lines which have been drawn to ground. The problem is that the threshold voltage that must be applied to the gates of the access transistors is quite high. Therefore, the time necessary for the gate voltage on the word lines to ramp from ground to the threshold voltage reduces the speed of the memory. Also, as memory cells decrease in size to increase the density of the memory, it becomes more difficult to keep the access transistors turned off due to the device physics of n-channel MOSFETS.

SUMMARY OF THE INVENTION

In accordance with one aspect of the invention, a device for sensing information stored in a dynamic memory location uses a sense amplifier that is connected to a pair of bit lines. The bit lines are coupled to selected memory locations. The sense amplifier senses a voltage differential between the bit lines and delivers a signal having a magnitude correlative to the sensed voltage differential. The voltage on either of the bit lines is then clamped to prevent the voltage from reaching ground potential.

Preferably, the sense amplifier uses first and second cross-coupled transistors. Each of the cross-coupled transistors has a source coupled to a common node, a drain coupled to one of the pair of bit lines, and a gate. The gate of the first cross-coupled transistor is coupled to the drain of the second cross-coupled transistor, and the gate of the second cross-coupled transistor is coupled to the drain of the first cross-coupled transistor.

A first grounding transistor has a source coupled to said common node, a drain adapted to couple to a reference potential, and a gate adapted to receive a first clock signal. In response to receiving the first clock signal, the first grounding transistor couples the common node to the reference potential. Therefore, the voltage at the common node is altered toward the reference potential at a first preselected rate. A second grounding transistor has a source coupled to the common node, a drain adapted to connect to the reference potential, and a gate adapted to receive a second clock signal. In response to the second clock signal, the second grounding transistor couples the common node to the reference potential. Therefore, the voltage at the common node is altered toward the reference potential at a second preselected rate, which is faster than the first preselected rate.

A clamping circuit is coupled between the sense amplifier and the ground potential. Preferably, the clamping circuit includes a clamping transistor which has a source coupled to the common node, a drain adapted to couple to a preselected voltage source, and a gate adapted to receive an activation signal. In response to receiving the activation signal, the clamping transistor selectively couples the common node to the preselected voltage and prevents the voltage at the common node from becoming substantially equivalent to the ground potential. In addition, the gate of the second grounding transistor is turned off to minimize the power drain on the preselected voltage source.

In accordance with another aspect of the present invention, a method for sensing information stored in a dynamic memory is provided. According to the method, a pair of voltage-carrying bit lines are connected to a reference potential through a selected resistance path of a sense amplifier. While the bit lines are connected to the reference potential, the voltage on either of the pair of bit lines is prevented from dropping to the reference potential.

BRIEF DESCRIPTION OF THE DRAWINGS

Advantages of the invention will become apparent upon reading the following detailed description and upon reference to the drawings in which.

Figure 1:
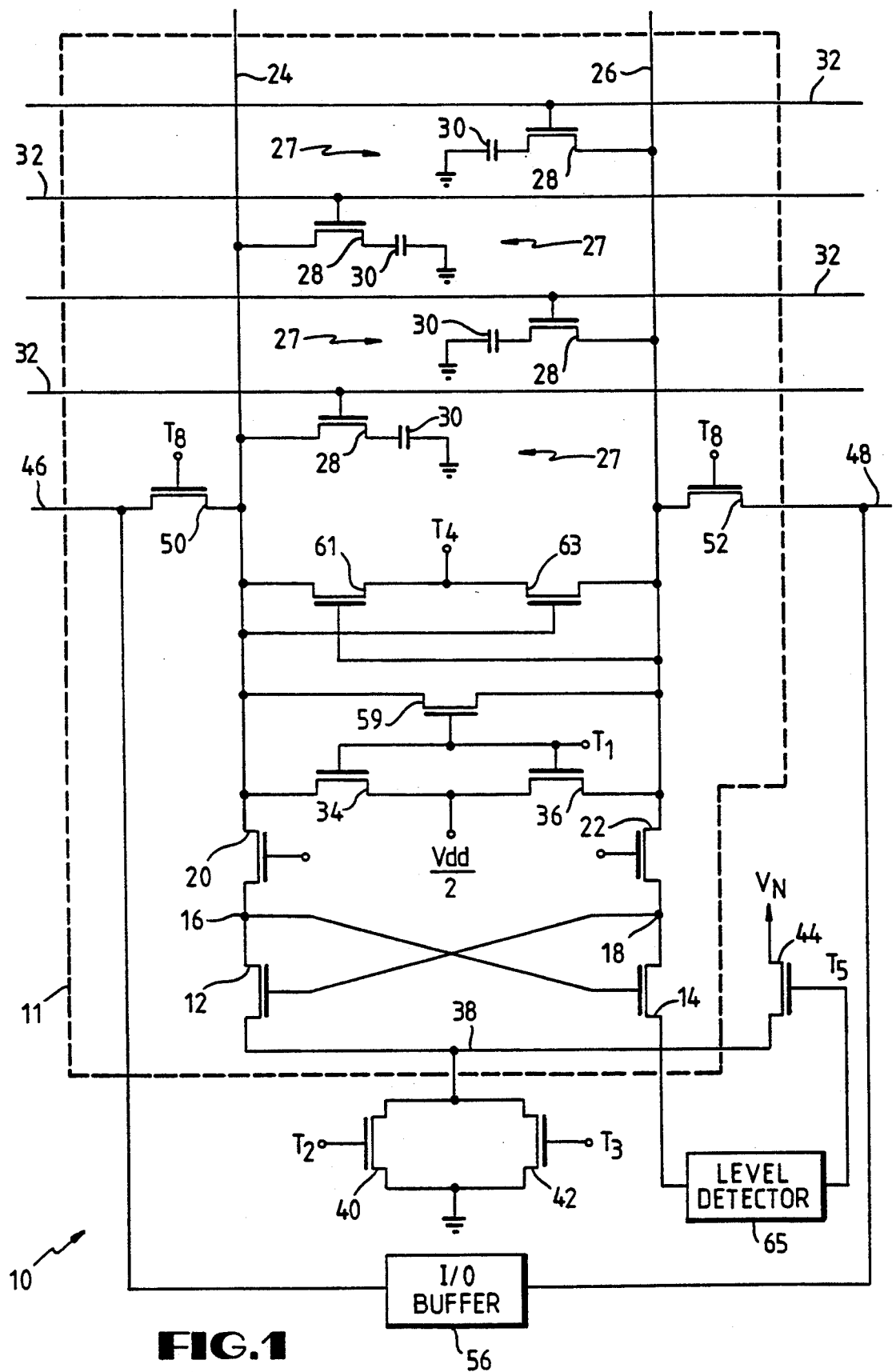
FIG. 1 is a schematic diagram of a folded dynamic memory cell array having a sense amplifier according to one embodiment of the present invention.

While the invention is susceptible to various modifications and alternative forms, specific embodiments have been shown by way of example in the drawings and described in detail herein. However, it should be understood that the invention is not intended to be limited to the particular forms disclosed. Rather, the invention is to cover all modifications, equivalents, and alternatives falling within the spirit and scope of the invention as defined by the appended claims.

DESCRIPTION OF THE PREFERRED EMBODIMENT

Turning now to the drawings and referring initially to FIG. 1, a dynamic random access memory circuit (DRAM) is illustrated and generally designated by the reference numeral 10. Preferably, the following discussion relates to a 4-megabit DRAM available from Micron Technology, Inc. of Boise, Id. as Model No. MT4C1004x. However, those skilled in the art will recognize that many different memory circuits could benefit from the teachings disclosed herein. In fact, the teachings probably become more applicable as the density of a memory array increases and as the size of the access transistors decrease. Thus, 64-megabit memories under development will probably gain the most advantage from these teachings.

The circuit 10 includes a sense amplifier 11 which has a pair of n-channel MOSFET transistors 12 and 14. The gates of the transistors 12 and 14 are cross-coupled to their opposing drains at nodes 16 and 18, respectively. In other words, the gate of the transistor 12 is connected to the drain of the transistor 14, and, similarly, the gate of the transistor 14 is connected to the drain of the transistor 12. The drains of the transistors 12 and 14 are also connected through isolating transistors 20 and 22 to a pair of balanced bit lines 24 and 26.

A large number of one-transistor memory cells 27 are connected to the bit lines 24 or 26. For instance, in the 4-megabit DRAM mentioned above, 128 cells 27 are connected to each bit line. Each cell 27 includes an access transistor 28 and a storage capacitor 30. The source of each transistor 28 is connected to one of the bit lines 24 or 26, and the drain of each transistor 28 is connected to one lead of its respective storage capacitor 30. The other lead of each storage capacitor 30 is preferably connected to a voltage source having a voltage of $V_{dd}/2$. The gates of the access transistors 28 of the memory cells 27 are connected to word lines 32. One of the word lines 32 is activated in each memory access cycle to connect one of the storage capacitors 30 to a bit line 24 or 26 through the access transistor 28. This connection produces a charge sharing function.

In a 4-megabit memory array fabricated on a single integrated circuit chip, there may be 256 memory cells 27 connected to one or the other of the bit lines 24 and 26. Therefore, the memory array would have 256 word lines 32. If so, there would be 16384 of the bit lines 24 and 16384 of the bit lines 26, and, thus, 16384 sense amplifiers 11.

As illustrated in FIG. 1, a "folded" bit line configuration may be used where the sense amplifiers 11 are at one edge of a block of the array with the bit lines 24 and 26 for a sense amplifier 11 extending in the same direction from the sense amplifier 11. Alternatively, an "open" bit line configuration may be used. In this alternative configuration, the sense amplifiers 11 may be located physically in the center of a block of the array, with the bit lines 24 and 26 (column line halves) extending out from the sense amplifiers 11 on each side.

Regardless of which configuration is used, the bit lines 24 and 26 are pre-charged to a preselected voltage level by a pre-charging circuit. The pre-charging circuit includes three transistors 34, 36 and 59. The sources of the transistors 34 and 36 are preferably coupled to a supply voltage $V_{dd}/2$, and the drains of the transistors 34 and 36 are coupled to the bit lines 24 and 26, respectively. The gate of the transistor 59 is coupled to the gates of the transistors 34 and 36. The source of the transistor 59 is coupled to one bit line 24, and the drain is coupled to the other bit line 26. The transistors 34, 36 and 59 receive a clock signal $T_1$ on their gates. As illustrated in FIG. 3B, the clock signal $T_1$ is high before and after each memory access to turn the transistors 34, 36 and 59 on, and the clock signal $T_1$ is low during a memory access to turn the transistors 34, 36 and 59 off. Therefore, between memory accesses, the bit lines 24 and 26 are charged to the supply voltage $V_{dd}/2$.

The sources of the two sense amplifier transistors 12 and 14 are connected together at a node 38. The node 38 is connected to ground or to the substrate through the source-to-drain paths of a pair of grounding transistors 40 and 42. Preferably, the grounding transistors 40 and 42 are different sizes. The transistor 40 is of a relatively high resistance, having a narrow channel area, and the transistor 42 is of a relatively low resistance, having a wide channel area. The transistor 40 is typically turned on first by a clock signal $T_2$ to begin the sense operation, and the transistor 42 is turned on by a clock signal $T_3$, after a delay following the turn-on of the transistor 40, to complete the sense operation. Those skilled in the art will recognize that the delay may be varied to optimize performance or reliability, and that the delay may be decreased to zero.

Figure 2:
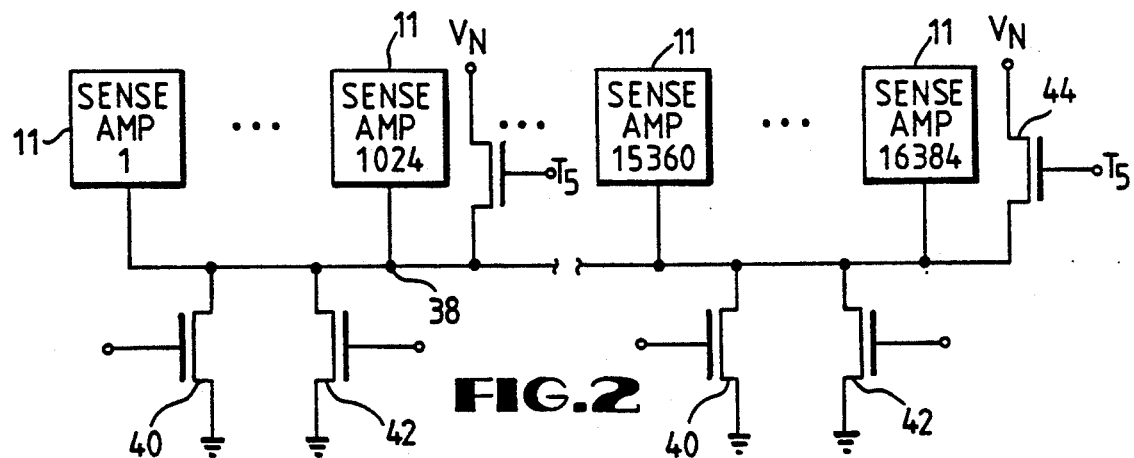
FIG. 2 is a schematic diagram of a portion of a 4-megabit memory generally showing a preferred proportion of sensing amplifiers to grounding and clamping devices.

It should be appreciated that the array of memory cells 27 is usually constructed with only a few sets of the two grounding transistors 40 and 42. Therefore, the transistors 40 and 42 are shared by a portion of the sense amplifiers 11 on the chip, rather than having a pair of the transistors 40 10 and 42 for each sense amplifier 11. As illustrated in FIG. 2, in a 4-megabit DRAM, there would be 16384 sensing amplifiers 11. Preferably, a set of grounding transistors 40 and 42 would be used to operate in cooperation with about 1024 sensing amplifiers 11. Therefore, each DRAM would have about sixteen sets of grounding transistors 40 and 42. Each set of transistors 40 and 42 can also be subdivided or partitioned along the 1024 sensing amplifiers 11 to minimize the effects of ground bus voltage drops.

Figure 3:
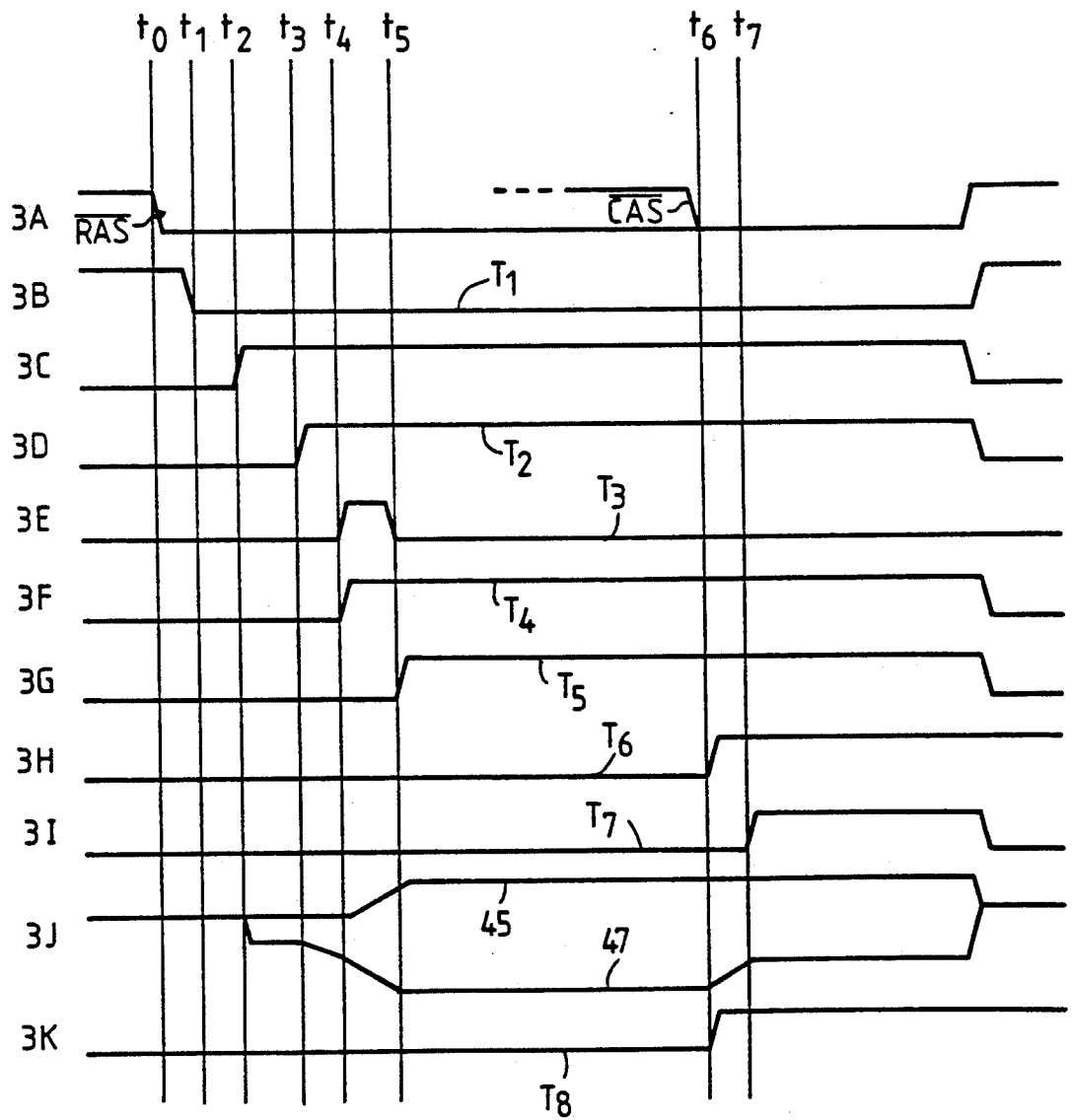
FIG. 3 is timing diagrams showing Events vs. Time for voltage waveforms and the like occurring during operation of the apparatus of FIG. 1.

Referring additionally to FIG. 3, the operation of the DRAM circuit 10 will be described. An access cycle for the DRAM circuit 10 begins when a row address strobe (RAS) falls at a time $t_0$, as illustrated in FIG. 3A. Before the word line 32 is addressed, the transistors 34, 36 and 59 are turned off by the falling clock signal $T_1$ at time $t_1$, as explained earlier. The RAS gates a row address into buffers (not shown) on the chip, and this row address is decoded to address one of the word lines 32 at time $t_2$, as illustrated in FIG. 3C. When one of the word lines 32 is addressed, a high voltage is provided on the word line 32. Thus, the gate of the associated transistor 28 receives the high voltage. This high voltage turns on the transistor 28 and causes the transistor 28 to share the charge on its storage capacitor 30 with the bit line 24 or 26. One bit line 24 or 26 remains at the initial precharged voltage, and the voltage on the other bit line 26 or 24 increases or decreases depending upon whether the storage capacitor 30 of the accessed memory cell 27 was storing a logical "1" ($V_{dd}$) or a logical "0" (ground) as illustrated by the curves 45 and 47 in FIG. 3J.

At time $t_3$, the clock signal $T_2$ goes high, as shown in FIG. 3D. The high clock signal $T_2$ turns on the transistor 40. Once activated, the transistor 40 begins to pull the voltage on the node 38 toward ground. Thus, the regenerative operation of the cross-coupled transistors 12 and 14 of the sense amplifier 11 begins. As the bit line 24 or 26 having a higher voltage begins to turn on the opposing transistor 14 or 12, the amount of conduction of the transistor 14 or 12 which has its gate tied to the bit line 24 or 26 having a lower voltage increases. As conduction of the transistor 14 or 12 increases, the voltage on the bit line 24 or 26 having a lower voltage further lowers and tends to turn off the transistor 14 or 12 which has its gate connected to the bit line 24 or 26 having a higher voltage.

The voltages on the bit lines 24 and 26 separate further during this period, then, at time $t_4$, the clock signal $T_3$ goes high, as shown in FIG. 3E. The high clock signal $T_3$ turns on the larger transistor 42. Since the larger transistor 42 has a lower resistivity that the smaller transistor 40, the speed of the regenerative operation of the transistors 12 and 14 increases rapidly in the same general manner as previously described. The voltage on node 38 and on the low-going bit line 24 or 26 falls rapidly toward circuit ground after time $t_4$ due to the large transistor 42 being turned on fully.

At or just after time $t_4$, a clock signal $T_4$ is delivered to the drains of a pair of p-channel MOSFETs 61 and 63. The source of each of the transistors 61 and 63 is coupled to a respective bit line 24 or 26, and the gate of each of the transistors 61 and 63 is coupled to the opposite respective bit line 26 or 24. Thus, while the clock signal $T_4$ is low before time $t_4$, each of the transistors 61 and 63 is off since no current can flow through them. When the clock signal $T_4$ goes high at time $t_4$, the voltage on the sources of the transistors 61 and 63 is higher than the voltages on the gates and drains of the transistors 61 and 63. Therefore, either the transistor 61 or 63 begins to conduct current and to pull up the bit line 26 or 24 that was not pulled down by the transistors 12 and 14. Thus, as one bit line is pulled down by the transistors 40 and 42 as shown by the curve 47 of FIG. 3J, the opposite bit line is pulled up toward $V_{dd}$ by the transistor 61 or 63 as shown by the curve 45 of FIG. 3J.

The voltage on the node 38 is prevented from dropping all the way to ground after the clock signal $T_3$ goes high. A transistor 44 connects the node 38 to a voltage $V_n$ through its source-to-drain path. Preferably, the voltage $V_n$, typically $V_{dd}$, and the size of the transistor 44 are selected to hold the node at a clamping voltage $V_c$ of about 0.3 V. Those skilled in the art will recognize that the voltage $V_n$ is equal to the clamping voltage $V_c$ plus the voltage drop across the transistor 44. A clock signal $T_5$ is received by the gate of the transistor 44. As illustrated in FIG. 3G, at time $t_5$ the clock signal $T_5$ goes high to turn on the transistor 44. Therefore, after time $t_5$, the transistor 44 clamps the voltage on the low-going bit line 24 or 26 to the clamping voltage $V_c$, and, thus, prevents the voltage on the low-going bit line 24 or 26 from falling to ground. As shown in FIG. 2, preferably one clamping transistor 44 is used to clamp the node 38 for each set of grounding transistors 40 and 42.

Also at time $t_5$, the clock signal $T_3$ goes low and turns off the low impedance transistor 42 to prevent excessive current drain on $V_n$ while the clamping transistor 44 prevents the node 38 from reaching ground. Due to the size and current carrying capabilities of the transistor 42, turning off the transistor 42 when the transistor 44 is turned on may be the only way to clamp the node 38 in some situations.

The time between $t_4$ and $t_5$ can be controlled by a simple delay circuit (not shown) that controls the timing of the other clock signals on the chip, or by a voltage level detector 65 that senses the voltage on the node 38 and switches $T_3$ and $T_5$ when the predetermined voltage is reached. However, using the clock signals from the delay circuit is preferred since the rate of the voltage drop between times $t_4$ and $t_5$ is easily ascertainable and quite consistent from one memory access to another. As a result, the node 38 can be clamped very near the predetermined clamping voltage level of $V_c$ every time.

By way of example, assume that a high voltage is provided on one of the word lines 32 that are connected to the bit line 26. The gate of the associated transistor 28 receives the high voltage and turns on. The transistor 28 then shares the charge on its storage capacitor 30 with the bit line 26. The voltage on the bit line 24 remains substantially constant, and the voltage on the other bit line 26 drops assuming that the accessed memory cell 27 was storing a logical "0" in the form of no charge on the storage capacitor 30. Therefore, the voltage on the bit line 26 will drop further than the voltage on the bit line 24. The curves 45 and 47 of FIG. 3J illustrate the voltages on the bit lines 24 and 26, respectively, during an access cycle.

At time $t_3$, the clock signal $T_2$ goes high, as shown in FIG. 3D. The high clock signal $T_2$ turns on the transistor 40. Once activated, the transistor 40 begins to pull the voltage on the node 38 toward ground. Thus, the regenerative operation of the cross-coupled transistors 12 and 14 of the sense amplifier 11 begins. As the bit line 24 begins to turn on the opposing transistor 14, the amount of conduction of the transistor 12 which has its gate tied to the bit line 26 decreases. As conduction of the transistor 14 increases, the voltage on the bit line 26 further lowers and tends to turn off the transistor 12 which has its gate connected to the bit line 26.

The voltages on the bit lines 24 and 26 separate further during this period, as illustrated by the slightly downwardly sloping portion of the curve 47 of FIG. 3J which represents the voltage on the bit line 26. Then, at time $t_4$, the clock signal $T_3$ goes high, as shown in FIG. 3E. The high clock signal $T_3$ turns on the larger transistor 42. Since the larger transistor 42 has a lower resistivity that the smaller transistor 40, the speed of the regenerative operation of the transistors 12 and 14 increases rapidly in the same general manner as previously described. The voltage on node 38 and on the low-going bit line 26 falls more rapidly toward circuit ground after time $t_4$, as illustrated by the steeply downwardly sloping portion of the curve 47. However, as previously explained, the transistor 44 prevents the voltage on the node 38 from dropping all the way to ground after the clock signal $T_3$ goes high. Instead, the transistor 44 clamps the voltage at node 38, and, thus, the voltage on the bit line 26, to about 0.3 V.

A data input/output path for the sense amplifier 11 of FIG. 1 is provided by data lines 46 and 48. The data lines 46 and 48 are coupled to the respective bit lines 24 and 26 by respective column-select transistors 50 and 52. The source-to-drain paths of the transistors 50 and 52 connect the data lines 46 and 48 to the bit lines 24 and 26, respectively. A column-select address line is connected to the gate of each respective transistor 50 and 52. The column-select lines select one out of a large number of columns in response to the output of a column address by a column decoder (not shown). The column address is gated into the chip by a column address strobe (CAS), as illustrated in FIG. 3A. After the CAS falls to a low voltage, the voltage on the gate of the selected one of the transistors 50 or 52 goes high at time $t_6$. Therefore, the transistor 50 or 52 is turned on, and the data line 46 or 48 is charge-coupled to its respective bit line 24 or 26.

Since one of the data lines 46 or 48 is coupled to its respective bit line 24 or 26, the voltage on the data line 46 will be different from the voltage on the data line 48. According to another feature of the present invention, an intermediate output buffer 56 senses and amplifies the voltage separation on lines 46 and 48 soon after the separation begins. However, like the previously discussed sense amplifier 11, the output buffer 56 prevents the voltage on the low-going data line 46 or 48 from dropping to ground. Instead, the voltage on the low-going data line 46 or 48 is clamped to a preselected voltage $V_x$.

Figure 4:
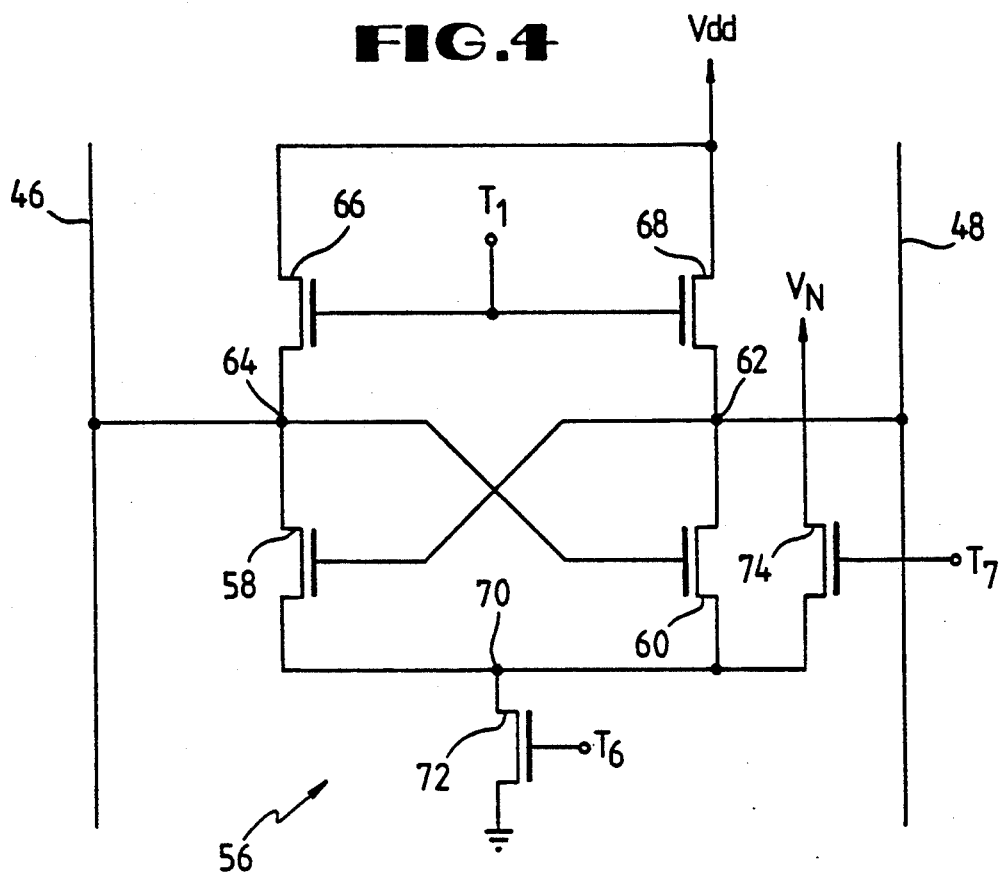
FIG. 4 is a schematic diagram of an intermediate output buffer in accordance with the present invention.

As illustrated in FIG. 4, the intermediate output buffer 56 includes a pair of transistors 58 and 60. The gates of the transistors 58 and 60 are cross-coupled to the opposing drains at nodes 64 and 62, respectively. In other words, the gate of the transistor 58 is connected to the drain of the transistor 60, and, similarly, the gate of the transistor 60 is connected to the drain of the transistor 58. The drains of the transistors 58 and 60 are also connected through pre-charging transistors 66 and 68, respectively, to a the supply voltage $V_{dd}/2$. The pre-charging transistors 66 and 68 are activated and deactivated by the clock signal $T_1$, as illustrated in FIG. 3A.

The sources of the transistors 58 and 60 are connected to a mutual node 70. The source of a grounding transistor 72 is also connected to the node 70, and the drain of the grounding transistor 72 is connected to ground. The grounding transistor 72 functions similarly to the transistors 40 and 42 of the sense amplifier 11 to pull the node 70 toward ground and initiate operation of the transistors 58 and 60. The gate of the transistor 72 is driven by a clock signal $T_6$ which goes high, as illustrated in FIG. 3H, shortly after the column address signal on the gate of the selected transistor 50 or 52 goes high. This tends to pull the voltage on the low-going data line 46 or 48 down toward ground.

To clamp the voltage in the low-going data line 46 or 48 above ground, a transistor 74 is source-to-drain connected between the preselected voltage $V_n$ and the node 70. The gate of the transistor 74 receives a clock signal $T_7$. At time $t_7$, as illustrated in FIG. 3I, the clock signal $T_7$ goes high, and, thus, turns on the transistor 74. While the transistor 74 is activated, the node 70 is tied to the preselected voltage $V_n$, so the voltage on the low-going data line 46 or 48 cannot drop below the clamping voltage $V_c$.

Figure 5:
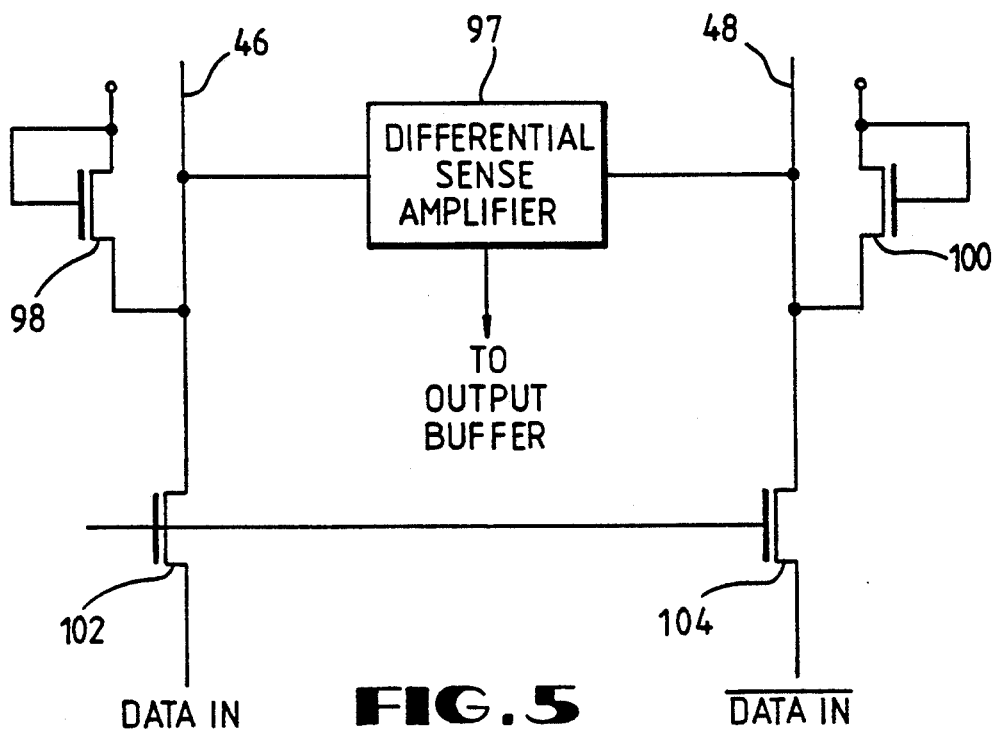
FIG. 5 is a schematic diagram of another intermediate output buffer in accordance with the present invention.

Alternatively, as illustrated in FIG. 5, the intermediate output buffer 56 includes a differential sense amplifier 97 that amplifies any differential in the voltages on lines 46 and 48 after the transistors 50 and 52 have been turned on by a clock signal $T_8$ at time $t_6$. The transistors 50 and 52 transfer the voltages on the bit lines 24 and 26, respectively, to the lines 46 and 48. The transistors 98 and 100 are sized to provide the correct bias levels for the differential sense amplifier 97 and to prevent the voltages on the bit lines 24 and 26 from reaching ground when the data on the bit lines 24 and 26 is written by turning on the transistors 102 and 104.

What is claimed is:

1. A device for sensing information stored in a dynamic memory location, said device comprising a sense amplifier coupling a pair of bit lines with a reference potential, said bit lines being coupled with selected memory locations, said sense amplifier being adapted for sensing a voltage differential between said bit lines and for generating a signal having a magnitude corresponding to said sensed voltage differential, said sense amplifier comprising:

first and second cross-coupled transistors each of said cross-coupled transistors having a source connected to a common node, a drain coupled to one bit line of said pair of bit lines, and a gate, the gate of said first cross-coupled transistor being coupled to said drain of said second cross-coupled transistor and said gate of said second cross-coupled transistor being coupled to said drain of said first cross-coupled transistor;

a first grounding transistor having a source coupled to said common node, a drain being adapted to couple to a reference potential, and a gate being adapted to a receive a first clock signal, said first grounding transistor coupling said common node to said reference potential in response to receiving said first clock signal and thereby altering a voltage at said common node toward said reference potential at a first preselected rate; and a second grounding transistor having a source coupled to said common node, a drain being adapted to couple to said reference potential, and a gate being adapted to receive a second clock signal, said second grounding transistor coupling said common node to said reference potential in response to receiving said second clock signal and thereby altering said voltage at said common node toward said reference potential at a second preselected rate, said second preselected rate being faster than said first preselected rate; and means for preventing the voltage of either of said bit lines from reaching said reference potential, said preventing means comprising a clamping transistor having a source coupled to said common node, a drain being adapted to couple to a preselected voltage source, and a gate being adapted to receive an activation signal, said clamping transistor selectively coupling said common node to said preselected voltage to prevent said voltage at said common node from becoming substantially equivalent to said reference potential in response to receiving said activation signal.

2. The device, as set forth in claim 1, wherein said second clock signal decouples said second grounding transistor from said reference potential substantially concurrently with said clamping transistor receiving said activation signal.

3. A sense amplifier for sensing information stored in a selected one of a plurality of dynamic memory cells, said amplifier comprising:

first and second cross-coupled transistors, each of said cross-coupled transistors having a source coupled to a common node, a drain coupled to a respective bit line, each bit line being selectively coupled to said plurality of memory cells, and a gate, the gate of said first cross-coupled transistor being coupled to the drain of said second cross-coupled transistor and the gate of said second cross-coupled transistor being coupled to the drain of said first cross-coupled transistor;

a grounding circuit coupled between said common node and a reference potential and being adapted to couple said common node to said reference potential in response to receiving a clock signal; and clamping means for preventing the voltage at said common node from reaching said reference potential, said clamping means being coupled between said common node and a preselected voltage source wherein said clamping means couples said common node to said preselected voltage source in response to receiving an activation signal, thereby maintaining the voltage at said common node at a clamping voltage wherein said clamping voltage is greater than said reference potential.

4. The amplifier, as set forth in claim 3, wherein said grounding circuit comprises:

a first grounding transistor having a source connected to said common node, a drain being adapted to connect to a reference potential, and a gate being adapted to receive a first clock signal, said first grounding transistor coupling said common node to said reference potential in response to receiving said first clock signal and thereby altering a voltage at said common node toward said reference potential at a first preselected rate; and a second grounding transistor having a source connected to said common node, a drain being adapted to connect to said reference potential, and a gate being adapted to receive a second clock signal, said second grounding transistor coupling said common node to said reference potential in response to receiving said second clock signal and thereby altering said voltage at said common node toward said reference potential at a second preselected rate, said second preselected rate being faster than said first preselected rate.

5. The amplifier, as set forth in claim 4, wherein said second clock signal decouples said second grounding transistor from said reference potential substantially concurrently with said clamping means receiving said activation signal.

6. The amplifier, as set forth in claim 3, wherein said clamping means comprises:

a clamping transistor having a source connected to said common node, a drain being adapted to connect to a preselected voltage source, and a gate being adapted to receive said activation signal, said clamping transistor selectively coupling said common node to said preselected voltage to prevent said voltage at said common node from becoming substantially equivalent to said reference potential in response to receiving said activation signal.

7. The amplifier, as set forth in claim 6, wherein said clamping voltage is about 0.3 volts.

8. A dynamic memory device comprising:

an array of memory cells arranged in rows and columns, and being coupled to row lines extending along said rows and to column lines extending along said columns;

each of said memory cells having an access transistor and a storage capacitor, the access transistor having a source-to-drain path coupled between the storage capacitor and one of said column lines and having a gate coupled to one of said row lines;

a plurality of sense amplifiers selectively coupled to selected pairs of said column lines, each one of said sense amplifiers having a pair of transistors having source-to-drain paths coupled between a common node and a respective one of said pair of said column lines;

a first grounding transistor having a source connected to said common node, a drain being adapted to connect to a reference potential, and a gate being adapted to receive a first clock signal, said first grounding transistor coupling said common node to said reference potential in response to receiving said first clock signal and thereby altering a voltage at said common node toward said reference potential at a first preselected rate;

a second grounding transistor having a source connected to said common node, a drain being adapted to connect to said reference potential, and a gate being adapted to receive a second clock signal, said second grounding transistor coupling said common node to said reference potential in response to receiving said second clock signal and thereby altering said voltage at said common node toward said reference potential at a second preselected rate, said second preselected rate being faster than said first preselected rate; and clamping means for preventing said voltage at said common node from becoming substantially equivalent to said reference potential, said clamping means being coupled between said common node and a preselected voltage source wherein said clamping means couples said common node to said preselected voltage source in response to receiving an activation signal, thereby maintaining the voltage at said common node at a clamping voltage wherein said clamping voltage is greater than said reference potential.

9. The device, as set forth in claim 8, wherein said second clock signal decouples said second grounding transistor from said reference potential substantially concurrently with said clamping means receiving said activation signal.

10. The device, as set forth in claim 8, wherein said clamping voltage is about 0.3 volts.

11. A method for sensing information stored in a dynamic memory, said method comprising the steps of:
coupling a selected pair of voltage carrying bit lines to a reference potential through a selected resistance path of a sensor amplifier, said coupling comprising the steps of:
delivering a first clock signal to a first grounding transistor having a source coupled to said sense amplifier, a drain coupled to said reference potential, and a gate coupled to receive said first clock signal, said first grounding transistor coupling said pair of bit lines to said reference potential in response to receiving said first clock signal; and
altering the voltage on said one of said pair of bit lines toward said reference potential at a first preselected rate; and
preventing the voltage on either of said pair of bit lines from reaching said reference potential by clamping the voltage on the selected bit line to a predetermined voltage greater than said reference potential.

12. The method, as set forth in claim 11, wherein said step of coupling further comprises the steps of:
delivering a second clock signal to a second grounding transistor having a source connected to said sense amplifier, a drain connected to said reference potential, and a gate connected to receive said second clock signal, said second grounding transistor coupling said pair of bit lines to said reference potential in response to receiving said second clock signal; and
altering the voltage on said one of said pair of bit lines toward said reference potential at a second preselected rate, said second preselected rate being faster that said first preselected rate.

13. The method, as set froth in claim 12, wherein said step of preventing comprises the steps of:
delivering a third clock signal to a camping circuit being coupled between said common node and a preselected voltage source, said clamping circuit selectively coupling said common node to said preselected voltage source to clamp said common node at said predetermined voltage.

14. A method of operating a dynamic memory device, said memory device having a plurality of bit lines connected to a plurality of memory cells, a plurality of sense amplifiers, each sense amplifier having a pair of cross-coupled transistors being source-to-drain connected between a common node and a pair of respective bit lines and being adapted to selectively couple voltage on one of said pair of respective bit lines to said common node, said method comprising the steps of:
coupling said common node to a reference potential through a high-resistance path at a first preselected time;
coupling said common node to said reference potential through a lower resistance path at a second preselected time after said first preselected time; and
clamping the voltage at said common node to a preselected voltage level different from said reference potential before said common node has discharged to said reference potential.

15. The method, as set forth in claim 14, wherein said first-mentioned step of coupling comprises the steps of:
delivering a first clock signal to a first grounding transistor having a source connected to said common node, a drain coupled to said reference potential, and a gate coupled to receive said first clock signal, said first grounding transistor coupling said common node to said reference potential in response to receiving said first clock signal; and
altering the voltage at said common node toward said reference potential at a first preselected rate.

16. The method, as set forth in claim 14, wherein said second-mention step of coupling comprises the steps of:
delivering a second clock signal to a second grounding transistor having a source coupled to said common node, a drain coupled to said reference potential, and a gate coupled to receive said second clock signal, said second grounding transistor coupling said common node to said reference potential in response to receiving said second clock signal; and
altering the voltage at said common node toward said reference potential at a second preselected rate, said second preselected rate being faster than said first preselected rate.

17. The method, as set forth in claim 16, wherein said step of clamping comprises the steps of:
delivering a third clock signal to a clamping transistor having a source connected to said common node, a drain coupled to a preselected voltage source, and a gate coupled to receive said third clock signal, said clamping transistor selectively coupling said common node to said preselected voltage source to prevent the voltage at said common node from dropping below said preselected voltage.

* * * * *